US007405623B2

(12) United States Patent
Kulasekeram

(10) Patent No.: US 7,405,623 B2
(45) Date of Patent: Jul. 29, 2008

(54) SENSING CIRCUIT

(75) Inventor: Nishanth Kulasekeram, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 57 days.

(21) Appl. No.: 11/352,366

(22) Filed: Feb. 13, 2006

(65) Prior Publication Data

US 2006/0220746 A1 Oct. 5, 2006

(30) Foreign Application Priority Data

Mar. 31, 2005 (GB) ................................ 0506599.0

(51) Int. Cl.
*H03F 3/45* (2006.01)

(52) U.S. Cl. ...................................... 330/260; 330/290

(58) Field of Classification Search ................. 330/260, 330/308, 290, 98–100
See application file for complete search history.

(56) References Cited

U.S. PATENT DOCUMENTS

| | | | | |
|---|---|---|---|---|
| 4,173,723 | A | 11/1979 | Temes et al. | |
| 6,288,575 | B1 | 9/2001 | Forbes | |
| 6,674,679 | B1 * | 1/2004 | Perner et al. | 365/209 |
| 7,113,043 | B1 * | 9/2006 | Jin et al. | 330/279 |
| 2003/0128055 | A1 | 7/2003 | Lin et al. | |

* cited by examiner

*Primary Examiner*—Robert Pascal
*Assistant Examiner*—Hieu P Nguyen
(74) *Attorney, Agent, or Firm*—Oliff & Berridge, PLC

(57) ABSTRACT

A sensing circuit capable of detecting very low current pulses of the order of 10's and 100's of micro amps. The sensing circuit comprises a common gate amplification stage capable of amplifying a sensed current, a comparison stage having as an input the amplified sensed current and a feedback stage capable of returning an output of the comparison stage to the common gate amplification stage.

13 Claims, 4 Drawing Sheets

SENSING CIRCUIT

The present invention relates to sensing circuits. In particular, the present invention relates to sensing circuits capable of detecting very low current pulses of the order of 10's and 100's of micro amps.

A basic known sensing circuit contains a sensing front end followed by a latch stage. Its function is to detect the charge stored in a selected memory element within a matrix of memory cells and thus to determine whether the selected memory element stores a '0' or a '1'.

Most existing sensing circuits are based on voltage sensing of a matrix of storage capacitors. The voltage level across the storage capacitor corresponds to the logic-state ('0' or '1'). In the simplest case, this voltage is compared to an intermediate value and the difference is amplified.

The sensing circuits of the prior art use common source transistors for preamplification, where the source of the transistor is connected to ground and the voltage Vin is input into the gate of the transistor. These transistors amplify the voltage Vin and output a voltage Vout at the drain.

Sensitive current preamplifiers are used in integrated circuits in order to achieve a low bit error rate in the front end. An optical receiver front end integrated on the same chip with digital circuitry in a cost-effective digital CMOS technology provides a low-cost solution for the digital mass installation of such systems.

The four basic preamplifier topologies commonly used for integrated photo-receivers are:

1) The simple low-resistor terminated amplifier;
2) the high-impedance amplifier;
3) the transimpedance amplifier; and
4) travelling wave (TW) or distributed amplifier.

FIG. 1 illustrates a differential transimpedance amplifier circuit of the prior art.

The front end stage comprises two common source transistors M1, M2. A voltage Vin+ is input into the gate of the common source transistor M1 and a voltage Vin− is input into the gate of the common source transistor M2. The drain of the common source transistors M1, M2 is connected to the source of cascoded transistors M3, M5 and M4, M6 respectively, to create a high impedance output on the drain of the common source transistors M1, M2. The source of the common source transistors M1, M2 is connected via DC common source to ground.

The gates of the cascoded transistors M3, M5 and M4, M6 are biased by the voltages bias1, bias2. The drain of the transistors M5, M6 is connected to the source of cascoded transistors M7, M9 and M8, M10, respectively, to further increase the impedance of the output from the drain of transistors M9, M10 which is connected to the source of the transistors M11, M12.

The drain of the common source transistors M1, M2 is also connected to the gate of the transistors M11, M12, respectively, and the source of the transistors M11, M12, respectively via the resistors $R_{f1}$, $R_{f2}$ and the capacitors $C_{f1}$, $C_{f2}$, so that the output from the common source transistors M1, M2 is fed back to the input of the common source transistors M1, M2.

The differential transimpedance amplifier circuit of the prior art as illustrated in FIG. 1 is unable to detect very low current pulses of the order of 10's and 100's of micro amps.

FIG. 2 illustrates a single-ended transimpedance preamplifier of the prior art. The circuit comprises a front end stage providing amplification and a buffer stage.

The front end stage comprises a common source transistor M1. The drain of the common source transistor M1 is connected, via a resistor $R_d$, to the voltage VDD, whilst the source of the common source transistor M1 is connected to ground. A current $I_{in}$ is input into the gate of the common source transistor M1 and a voltage $V_{in}$ is output from the drain of the common source transistor M1.

The output voltage $V_{in}$ is input into the gate of a common drain transistor M2, which forms part of the buffer stage. The drain of the common drain transistor M2 is connected to the voltage VDD, whilst the source of the common drain transistor M2 is connected, via a resistor $R_s$, to ground. The source of the common drain transistor M2 is also connected, via a resistor $R_f$, to the gate of the common source transistor M1 to form a feedback circuit. The source of the common drain transistor M2 outputs the signal $V_{out}$.

The transimpedance preamplifier of the prior art as illustrated in FIG. 2 is unable to detect very low current pulses of the order of 10's and 100's of micro amps.

According to the present invention, there is provided a sensing circuit comprising a common gate amplification stage capable of amplifying a sensed current, a comparison stage having as an input the amplified sensed current and a feedback stage capable of returning an output of the comparison stage to the common gate amplification stage.

In another embodiment the amplification stage comprises a common gate transistor.

In another embodiment the common gate transistor is connected in series between first and second loads.

In another embodiment the first and second loads are resistors.

In another embodiment at least one of the loads is a transistor, a gate of which is biased by bias circuitry.

In another embodiment the common gate amplification stage is capable of amplifying a second sensed current.

In another embodiment the comparison stage further has as an input the second amplified sensed current.

In another embodiment the comparator is a differential voltage comparator.

In another embodiment the output of the comparison stage is input into a buffer stage.

In another embodiment the buffer stage comprises a common drain transistor.

In another embodiment the output of the buffer stage is input into the feedback stage and a second buffer stage.

In another embodiment the second buffer stage comprises a common drain transistor.

In another embodiment the circuit is capable of sensing a signal of 100 μA or less.

In another embodiment a photodiode produces the current to be sensed.

The present invention will now be described by way of example only with reference to the following drawings, in which FIG. 1 is a schematic illustration of a conventional differential transimpedance amplifier circuit;

The present invention provides a sensing circuit comprising a low impedance front end stage providing first stage amplification, a differential voltage comparator stage providing second stage voltage amplification, a first buffer stage providing DC level shifting, a feedback stage and a second buffer stage.

Figure 1:
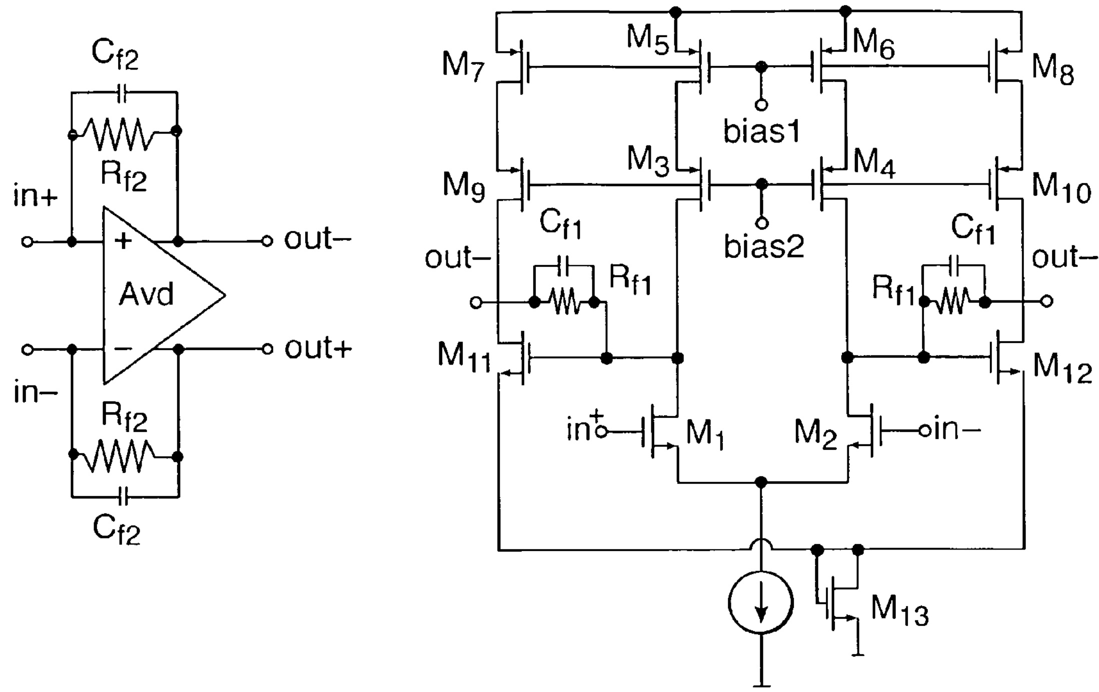
Figure 2:
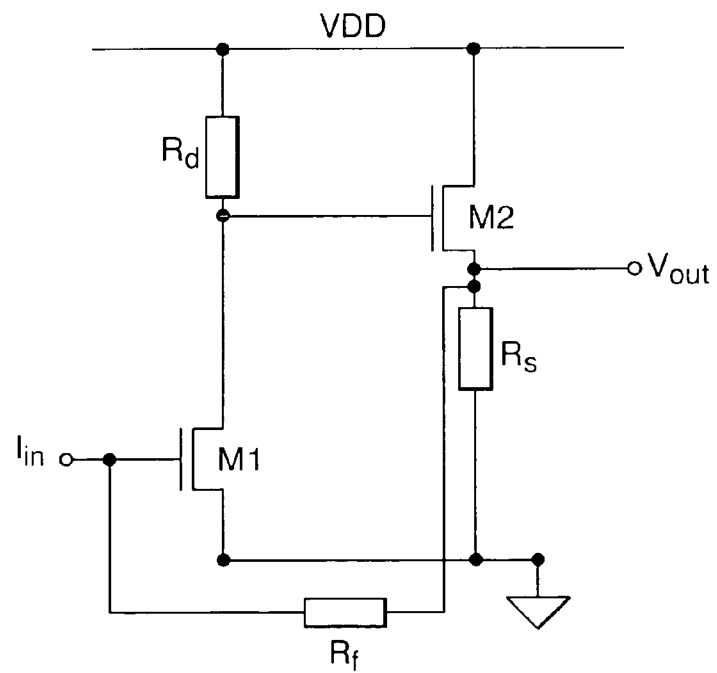
FIG. 2 is a schematic illustration of a conventional a single ended transimpedance preamplifier.
Figure 3:
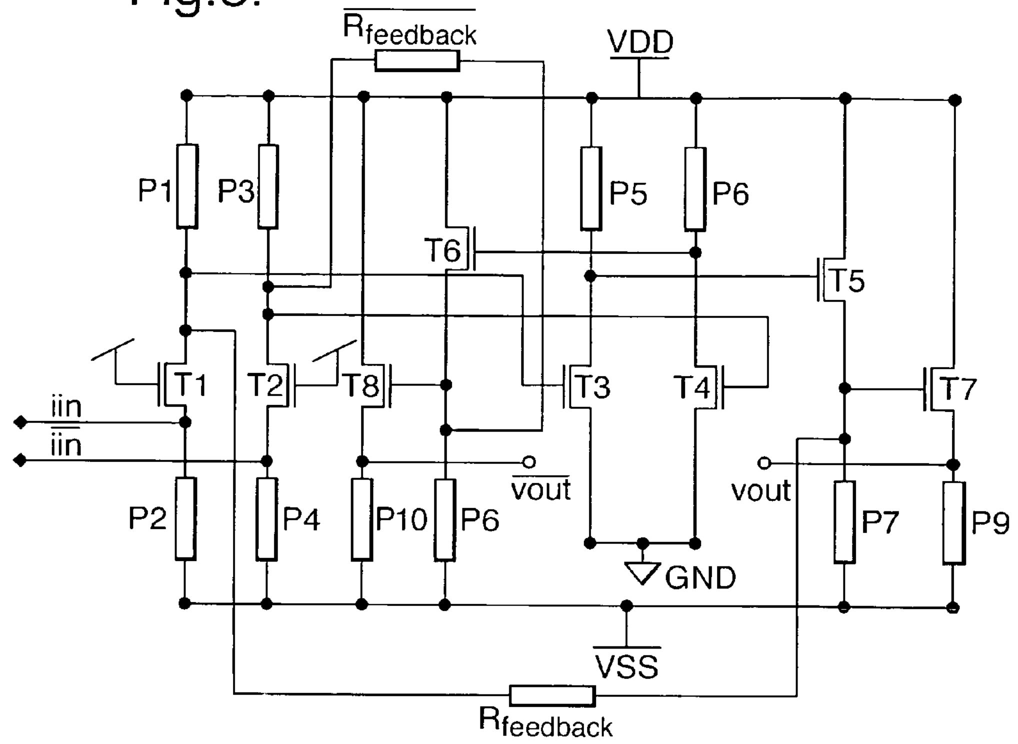
FIG. 3 is a schematic illustration of a transimpedance preamplifier of one embodiment of the present invention.

FIG. 3 illustrates of a transimpedance preamplifier sensing circuit of one embodiment of the present invention.

The transimpedance preamplifier sensing circuit of the present invention comprises a low impedance front end, which provides first stage amplification. The front end comprises two common gate amplification stages. Each common gate amplification stage comprises a common gate transistor T1, T2 connected in series between two passive devices P1, P2 and P3, P4 such as resistors, respectively. Additionally, a bias is applied to the gate of both common gate transistors T1 and T2.

A small signal current $i_{in}$ is input into the source of the common gate transistor T1 and a small signal current $\bar{i}_{in}$ is input into the source of the common gate transistor T2. The input currents could be fed from a flip flop memory cell. Alternatively, the input $i_{in}$ could be fed from a sensing device, whilst the input $\bar{i}_{in}$ could be fed from a reference current source, which could be another sensing device that is not exposed to the conditions to be tested.

As the gates of the common gate transistors T1, T2 are already biased, there is no need for the sensed currents to be at a sufficient voltage to overcome the threshold voltage of the common gate transistors T1, T2. Thus, the inputs $i_{in}$, $\bar{i}_{in}$ are low impedance inputs.

The inputs $i_{in}$, $\bar{i}_{in}$, are suitably amplified at the front end stage by the common gate transistors T1, T2 respectively. The degree of amplification can be controlled by selecting the resistances of resistors P1, P2 and P3, P4 as desired.

The use of common gate transistors T1, T2, in the front end stage of the sensing circuit enables the sensing circuit to sense very low current pulses of the order of 10's and 100's of micro amps. Therefore, the sensitivity of the sensing circuit of the present invention is greatly improved over those of the prior art. Additionally, the sensing circuit provides greater amplification than the circuits of the prior art, whilst minimising noise.

The common gate transistors T1, T2 are sized optimally to introduce the least amount of electrical noise, compared with conventional sense circuit input configurations. This in turn improves the sensitivity of the front end. Additionally, the use of common gate transistors in the front end stage directly influences the operational frequency, and hence the bandwidth of the sensing circuit.

A voltage $V_{in}$ is output from the drain of the common gate transistor T1 and input into the gate of a common source transistor T3, whilst a voltage $\bar{V}_{in}$ is output from the drain of the common gate transistor T2 and input into the gate of a common source transistor T4.

The common source transistors T3, T4 together form part of the differential voltage comparator stage. The respective sources of the common source transistors T3, T4 are connected to ground GND, whilst the respective drains of the common source transistors T3, T4 are connected via passive devices P5, P6 such as resistors to the voltage VDD.

The differential voltage comparator stage compares the voltages $V_{in}$ and $\bar{V}_{in}$ and provides second stage amplification. A high impedance voltage represented by $V_{in}$-$\bar{V}_{in}$ is output from the drain of the common source transistor T3 and input into the gate of a common drain transistor T5, whilst a high impedance voltage represented by $\bar{V}_{in}$-$V_{in}$ is output from the drain of the common source transistor T4 and input into the gate of a common drain transistor T6.

The common drain transistors T5, T6 together form part of the first buffer stage. The respective sources of the common drain transistors T5, T6 are connected via passive devices P7, P8 such as resistors to the voltage source VSS, whilst the respective drains of the common drain transistors T5, T6 are connected to the voltage source VDD.

The common drain transistors T5 and T6 function as buffers and provide DC level shifting.

An output from the source of the common drain transistor T5 is fed back, via the resistor $R_{feedback}$, onto the drain of the common gate transistor T1, and an output from the source of the common drain transistor T6 is fed back, via the resistor $\bar{R}_{feedback}$, onto the drain of the common gate transistor T2.

The output from the source of the common drain transistor T5, T6 is fed back to the drain of the common gate transistor T1, T2 respectively. This arrangement forms the feedback stage.

The feedback stage is particularly beneficial where the input is a current provided by a photodiode, such as a photodiode in an integrated photoreceiver. This is because photodiodes tend to produce a high input capacitance. The feedback stage provides isolation of any input capacitance and enhances the bandwidth.

An output from the source of the common drain transistor T5 is also fed back onto the gate of a common drain transistor T7, whilst an output from the source of the common drain transistor T6 is fed back onto the gate of a common drain transistor T8.

The common drain transistors T7, T8 together form part of the second buffer stage. The respective sources of the common drain transistors T5, T6 are connected via passive devices P9, P10 such as resistors to the voltage source VSS, whilst the respective drains of the common drain transistors T7, T8 are connected to the voltage source VDD.

The common drain transistors T7, T8 function as buffers and provide the capability of driving low impedance loads.

The source of the common drain transistor T7 outputs the signal $V_{out}$, whilst the source of the common drain transistor T8 outputs the signal $\bar{V}_{out}$.

Figure 4:
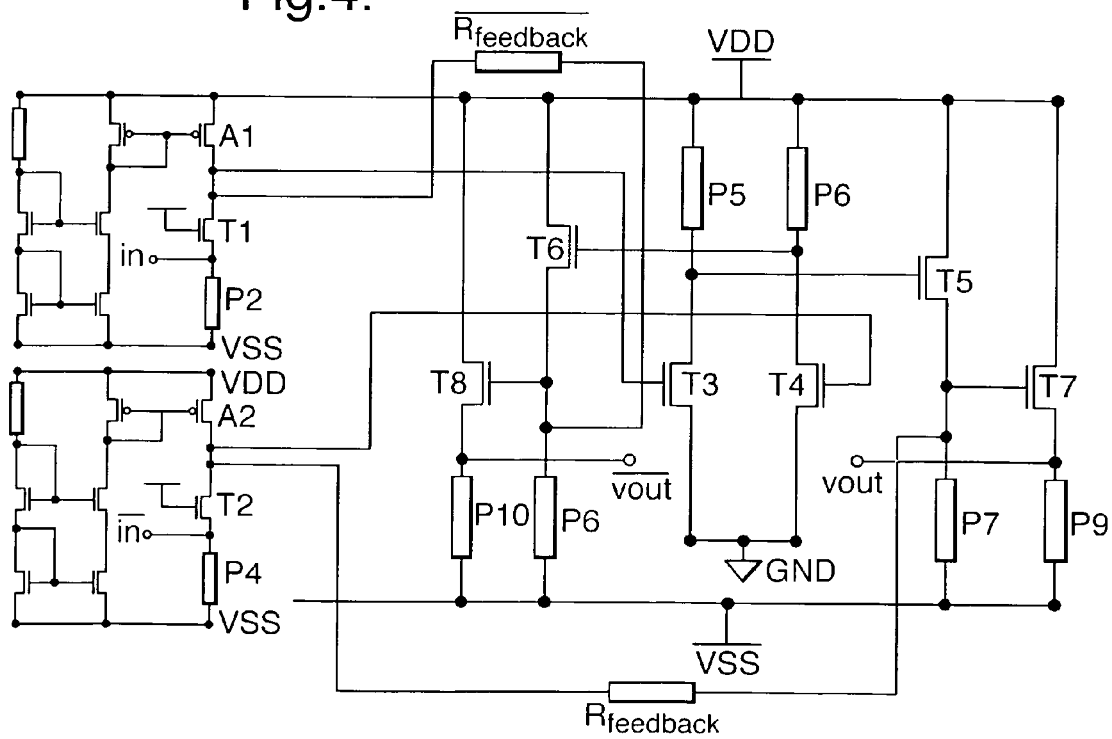
FIG. 4 is a schematic illustration of a transimpedance preamplifier of a further embodiment of the present invention.

FIG. 4 illustrates a transimpedance preamplifier of a further embodiment of the present invention having an enhanced input stage consisting of active devices rather than passive devices.

As can be seen from a comparison of FIGS. 3 and 4, the circuit shown in FIG. 4 includes the same differential voltage comparator stage providing second stage voltage amplification, first buffer stage, feedback stage and second buffer stage as illustrated in FIG. 3. These will not be described further.

However, the front end stage in FIG. 4 differs from the low impedance front end stage in FIG. 3. Specifically, passive devices P1 and P3 in the respective common gate input stages have been replaced by active devices A1, A2 in the form of transistors. Each transistor is biased by a respective bias circuit.

An active device, from a processing point of view, has much less device variation than a passive device such as a resistor. This is because resistors can exhibit a 10-15% tolerance depending whether they are poly resistors or nwell resistors. Accordingly, in practice the values of resistors P1 and P3 illustrated in FIG. 3 may differ considerably and consequently the amplification provided by the respective common gate amplification stages in the front end stage of the circuit illustrated in FIG. 3 may also differ considerably. In view of the small currents that the circuit is intended to sense, this can cause difficulties.

Replacing the resistors P1 and P3 in FIG. 3 with biased transistors A1, A2 in FIG. 4 considerably alleviates this problem since the characteristics of the biased transistors A1, A2 are much easier to match than the resistances of the resistors P1 and P3. Accordingly, the circuit in FIG. 4 is preferred where more accurate detection of smaller currents is desired.

The circuits shown in FIGS. 3 and 4 can detect very small input signals and produce a small output. For example, the sensing circuit of the present invention can sense an input current of approximately 100 μA and output a voltage of approximately 100 mV. Additionally, the circuits exhibit increased speed since they use fast, small transistors and very high bandwidth, when compared to sensing circuits of the prior art. The sensing circuit of the present invention has a −3 dB bandwidth of approximately 5 GHz/s and a data rate of approximately 10 Gbits/s.

The circuits illustrated in FIGS. 3 and 4 comprises two branches, each branch respectively capable of amplifying one of the two inputs, $i_{in}$, $\bar{i}_{in}$. However, in an alternative embodiment, the circuits of the present invention may only comprise one branch and amplify only one input. In this instance, the comparator stage compares the voltage Vin with a reference voltage.

The preamplifier circuits of the present invention can be used as sensing circuits in active and passive matrix FERAM, DRAM and SRAM type applications. Additionally, the preamplifier circuits of the present invention could be further used in medical applications, biosensor circuits, and high speed optical transceivers. Other applications will be apparent to those skilled in the art.

It is preferred that the present invention, including the circuits shown in FIGS. 3 and 4, is implemented using CMOS transistors. In addition, it is preferred that various devices in the circuits are matched.

However, implementations other than CMOS, such as TFTs are also possible, although these may require a different topology. In addition, there is no requirement to use the specific circuit implementations shown in the figures. Thus, different arrangements of stages can be used. Moreover, the circuitry in the individual stages need not be used. Other arrangements using different combinations of P-type and N-type transistors or other switching devices are also possible.

The circuit topology in the above-described embodiment for the common gate and differential input structures is intended to provide an improved power saving, achievable through the use of low voltage transistors.

FIGS. 5 to 9 illustrate simulation results achieved using a transimpedance preamplifier receiver of the present invention. The specification set in these simulations were: differential wide bandwidth −3 dB, 5.6 GHz; differential transimpedance gain 57.0 dB; input referred current noise 8.18 pA/√Hz, measured at 5 GHz, supply rails +/−3.3 V; operating temperature range of −40° C. to +85° C.; input current sensitivity 100 μA; and differential outputs.

Figure 5:
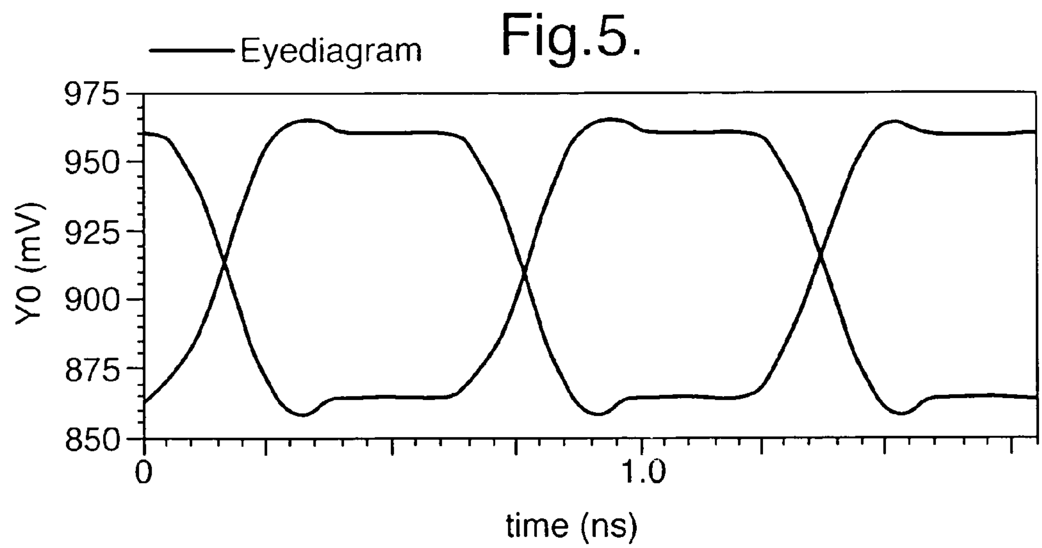
FIG. 5 illustrates an eye diagram of an optical receiver of a transimpedance preamplifier receiver of the present invention, measured at the output of the receiver.
Figure 6:
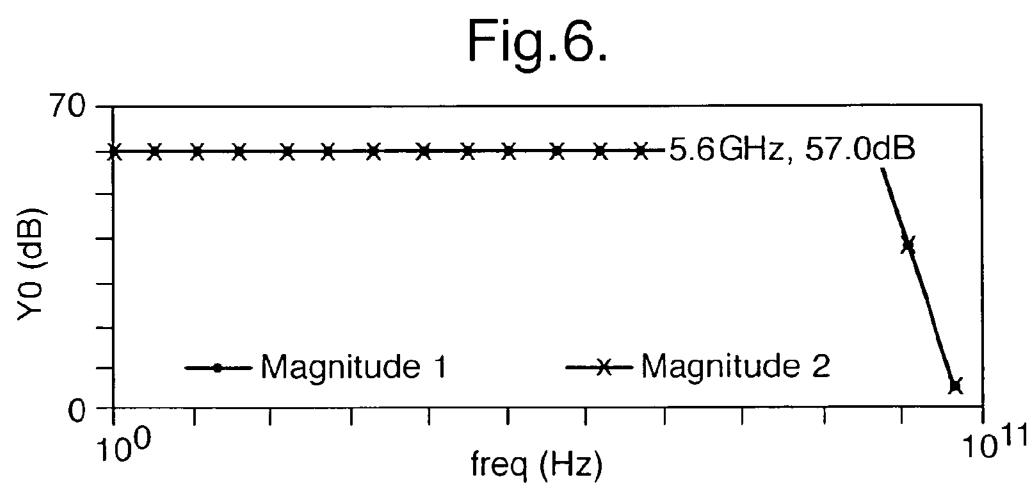
FIG. 6 illustrates a frequency response of a transimpedance preamplifier receiver of the present invention.
Figure 7:
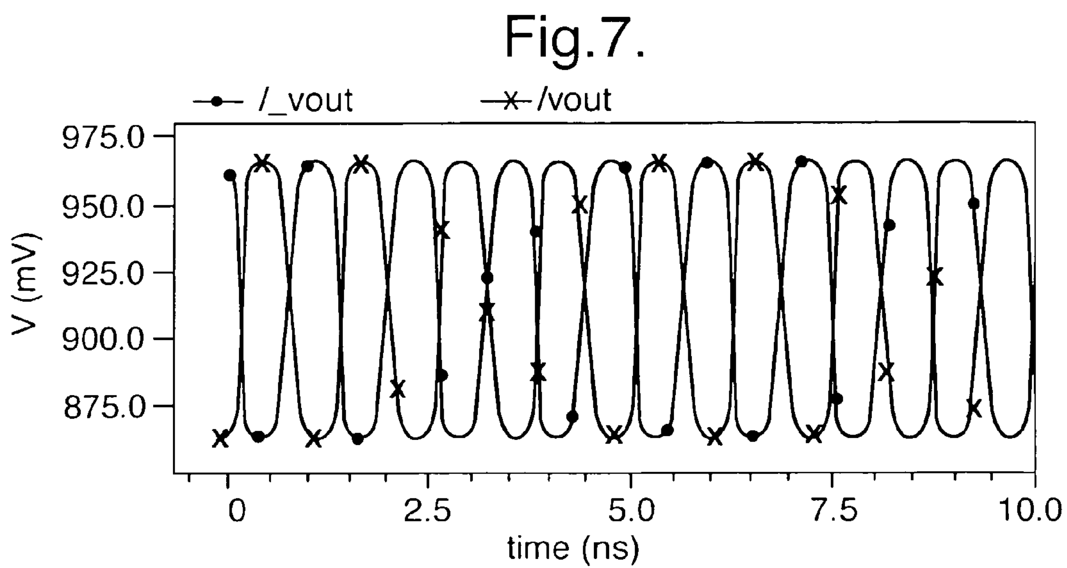
FIG. 7 illustrates the transient differential output from a transimpedance preamplifier receiver of the present invention.
Figure 8:
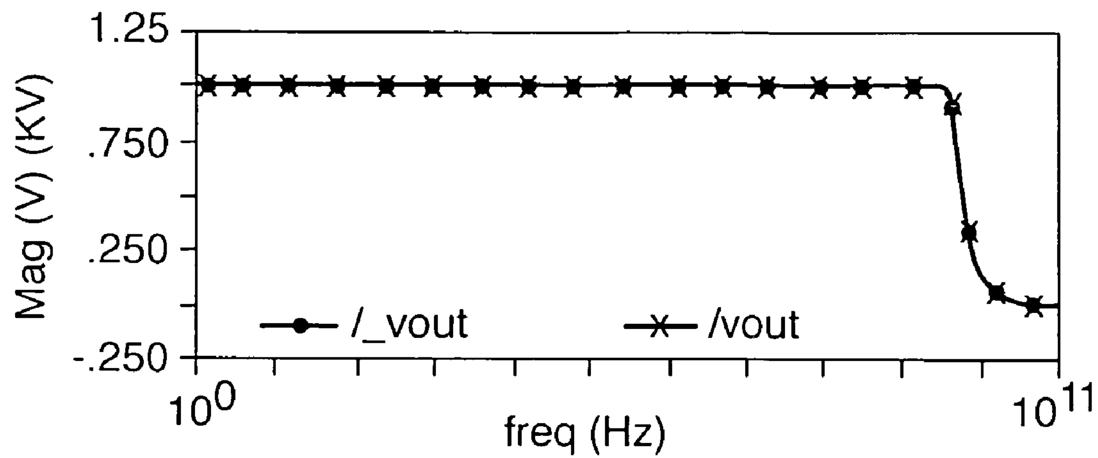
FIG. 8 illustrates the AC response of a differential output from a transimpedance preamplifier receiver of the present invention.
Figure 9:
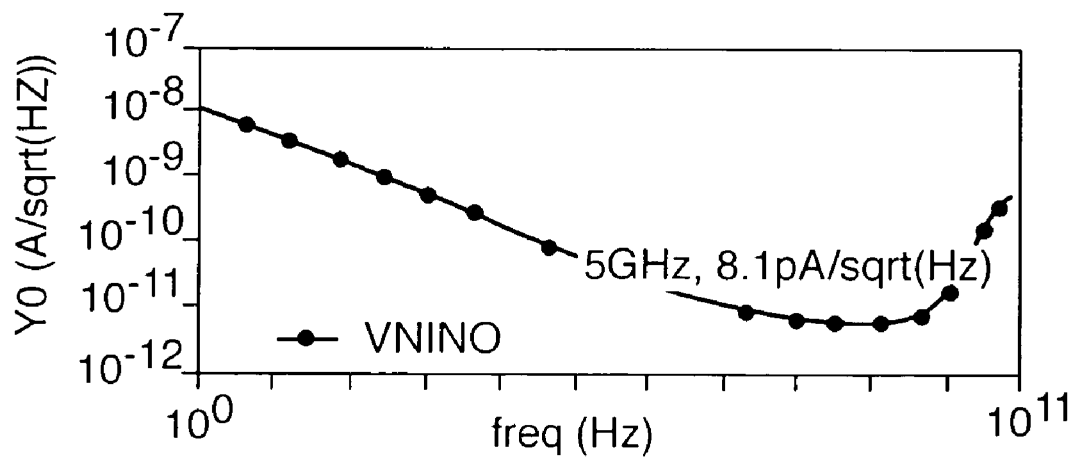
FIG. 9 illustrates the equivalent input referred noise current density of a transimpedance preamplifier receiver of the present invention.

FIG. 5 illustrates an eye diagram of an optical receiver of a transimpedance preamplifier receiver of the present invention, measured at the output of the receiver. FIG. 6 illustrates a frequency response corresponding to the differential output of a transimpedance preamplifier receiver of the present invention having −3 dB, a gain of 57.0 dB and an operation differential bandwidth of 5.6 GHz. FIG. 7 illustrates the transient differential output from a transimpedance preamplifier receiver of the present invention. FIG. 8 illustrates the AC response of a differential output from a transimpedance preamplifier receiver of the present invention. Finally, FIG. 9 illustrates the equivalent input referred noise current density of a transimpedance preamplifier receiver of the present invention, of 8.18 pA/√Hz, measured at 5 GHz.

The foregoing description has been given by way of example only and it will be appreciated by a person skilled in the art that modifications can be made without departing from the scope of the present invention.

The invention claimed is:

1. A sensing circuit comprising:
a common gate amplification stage capable of amplifying a sensed current;
a comparison stage including two transistors and having as an input into gates of both transistors the amplified sensed current; and
a feedback stage capable of returning an output of the comparison stage to the common gate amplification stage;
wherein the comparison stage is a differential voltage comparator.

2. A sensing circuit according to claim 1, wherein the amplification stage comprises a common gate transistor.

3. A sensing circuit according to claim 2, wherein the common gate transistor is connected in series between first and second loads.

4. A sensing circuit according to claim 3, wherein the first and second loads are resistors.

5. A sensing circuit according to claim 3, wherein at least one of the loads is a transistor, a gate of which is biased by bias circuitry.

6. A sensing circuit according to claim 1, wherein the common gate amplification stage is capable of amplifying a second sensed current.

7. A sensing circuit according to claim 6, wherein the comparison stage further has as an input the second amplified sensed current.

8. A sensing circuit according to claim 1, wherein the output of the comparison stage is input into a buffer stage.

9. A sensing circuit according to claim 8, wherein the buffer stage comprises a common drain transistor.

10. A sensing circuit according to claim 8, wherein the output of the buffer stage is input into the feedback stage and a second buffer stage.

11. A sensing circuit according to claim 10, wherein the second buffer stage comprises a common drain transistor.

12. A sensing circuit according to claim 1, wherein the circuit is capable of sensing a signal of 100 μA or less.

13. A sensing circuit according to claim 1, wherein a photodiode produces the current to be sensed.

* * * * *